(12) United States Patent
Takanashi et al.

(10) Patent No.: US 6,806,032 B2
(45) Date of Patent: Oct. 19, 2004

(54) NEGATIVE-TYPE PHOTOSENSITIVE RESIN COMPOSITION

(75) Inventors: Hiroshi Takanashi, Tokyo (JP); Tomoya Kudo, Kanagawa-ken (JP); Takekazu Obata, Kanagawa-ken (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 64 days.

(21) Appl. No.: 10/357,472

(22) Filed: Feb. 4, 2003

(65) Prior Publication Data
US 2003/0170569 A1 Sep. 11, 2003

(30) Foreign Application Priority Data
Feb. 5, 2002 (JP) .......................................... 2002-28484

(51) Int. Cl.[7] .......................... G03F 7/031; G03F 7/029; G03F 7/033; C08F 122/26; C08F 22/26
(52) U.S. Cl. ................... 430/288.1; 430/910; 522/172; 522/176; 522/186; 526/279; 526/312; 526/323.1
(58) Field of Search ................................ 526/279, 312, 526/323.1; 430/288.1, 910; 522/172, 176, 186

(56) References Cited

U.S. PATENT DOCUMENTS

| | | | |
|---|---|---|---|
| 4,026,826 A | * | 5/1977 | Yoshida et al. |
| 4,603,086 A | * | 7/1986 | Fujii et al. |
| 4,849,461 A | * | 7/1989 | Lee et al. |
| 5,453,429 A | * | 9/1995 | Bliem et al. |
| 5,723,261 A | * | 3/1998 | Yanagawa et al. |

FOREIGN PATENT DOCUMENTS

| | | |
|---|---|---|
| EP | 687 713 | * 12/1995 |
| JP | 60-190427 | 9/1985 |
| JP | 03-172301 | 7/1991 |
| JP | 07-008908 | 1/1995 |
| JP | 07-331179 | 12/1995 |

* cited by examiner

*Primary Examiner*—Richard L. Schilling
(74) *Attorney, Agent, or Firm*—Wenderoth, Lind & Ponack, L.L.P.

(57) ABSTRACT

Disclosed is a negative-type photosensitive resin composition comprising component (A) that is a product of the Michael addition reaction between an amino group-containing compound (a-1) represented by the general formula (I):

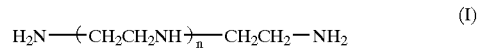

(wherein n is an integral number of 1–4), and a polyethyleneglycol di(meth)acrylate (a-2) represented by the general formula (II):

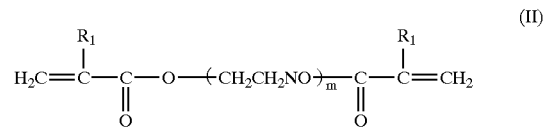

(wherein $R_1$ is a hydrogen or a methyl, and m is an integral number of 4–14). The composition of the invention is broadly be applicable in the technical fields of photo masks for etching use in the fabrication of CRT shadow masks, and lead frames for the mounting of IC chips; phosphor patterning of CRT; and further those of photosensitive resin plates, dry films, aqueous photosensitive paints, and aqueous photosensitive adhesives, etc. The composition of the invention has water resistance in spite of its capability of being developed with water and produce effects of enduring acidic wet-etching and repetitive steps of development.

12 Claims, No Drawings

NEGATIVE-TYPE PHOTOSENSITIVE RESIN COMPOSITION

BACKGROUND OF THE INVENTION

1. Field of the Invention

The present invention relates to a negative-type photosensitive resin composition. More specifically, it relates to a negative-type photosensitive resin composition and the Michael addition reaction product to be used for producing the composition. The present invention can advantageously be used in a wide variety of technical fields such as those of photo masks for etching use in the fabrication of CRT shadow masks, and lead frames for the mounting of IC chips; phosphor patterning of CRT; and further those of photosensitive resin plates, dry films, aqueous photosensitive paints, and aqueous photosensitive adhesives.

2. Description of the Related Art

Heretofore, in the manufacture of shadow masks and aperture grills for a cathode ray tube (CRT), and lead frames for the mounting of IC chips, a chrome-based photosensitive resin composition, such as a casein/chrome-based water-soluble photosensitive resin composition or a polyvinylalcohol (PVA)/chrome-based water-soluble photosensitive resin, has been used as a photoresist mask to be used in the process of etching a metal substrate. A PVA/chrome-based water-soluble photosensitive resin has also been used as a photoresist for use in phosphor patterning of CRT in a dot or stripe pattern on a transparent panel.

Specifically, for example, in the process of manufacturing a CRT shadow mask, a long metal thin plate, approximately 0.1–0.3 mm in thickness, made of 42 alloy (a nickel content of 42%), invar material (a nickel content of 36%), low carbon aluminum killed steel, or the like, is used as a substrate. Both surfaces of the substrate are defatted and washed with water, and then a photosensitive resin composition, which is generally a casein/ammonium dichromate based water-soluble photosensitive resin composition, is applied on both surfaces of the substrate, followed by drying, thereby to form a coating film. After that, a mask pattern having an objective image (pattern) to be formed is brought into close contact with the coating film, and then be exposed the double-sided film-formed substrate, covered with the mask pattern each, to light emitted from an exposure device such as an extra-high pressure mercury lamp. At that time, the masks on both side of the substrate be aligned such that the images (patterns) thereof are in register with each other. After the exposure to light, the substrate is developed using water to form patterns. Subsequently, the substrate with the patterns is dipped into a chromic anhydride solution, then washed with water. After washing, the patterned coating film is subjected to hardening by burning, thereby to form a cured photoresist pattern with increased etching-resistance. Then, an exposed or a photoresist-uncovered area of the substrate is etched with an etching solution of ferric chloride or the like (acidic etching) to form a plurality of pores through which electron beams be transmitted. After that, the photoresist pattern is stripped away, and then the substrate is cut into pieces to obtain shadow masks.

In the phosphor patterning of CRT, a phosphor (e.g., a blue phosphor) with particle sizes of ranging from several micrometers to ten-plus micrometers in diameter is dispersed and suspended in an aqueous PVA/ammonium dichromate mixed solution to obtain a slurry. Subsequently, the front surface portion (panel) of a CRT is turned in a slanting posture and said slurry is then introduced into the inner side of the panel so as to be uniformly applied, followed by drying to form a coating film. After that, the shadow mask manufactured by the above-mentioned method is attached on the panel, and then exposed to light from an extra-high pressure mercury lamp being located at the position onto which an electron gun will be placed after the completion of the CRT. Corresponding portions of the coating film to an aperture (a beam-passing opening) of the shadow mask is exposed to light. In the exposed portions of the coating film, hexavalent chromium is reduced into trivalent chromium and is coordinated with PVA, which resulted in the exposed portions be insolubilized (photocured). After the exposure to light, development with hot water is performed, whereby to form photo-cured phosphor patterns. In the case of a color CRT, other two additional photo-cured phosphor patterns (e.g., red and green) are respectively also formed as the same manner as described above. An extra-high pressure mercury lamp is placed at a position corresponding to an electron gun for each color.

The dichromate-containing water-soluble photosensitive resin composition to be used in the fabrication of these electronic parts is capable of forming a pattern having excellent properties of resolution, resistance to etching, and so on, although there are some disadvantages: a dark reaction is apt to occur and is strongly affected by a temperature and a humidity, whereby changes or variations in sensitivity may also occur; stability deteriorates with time and poor preservation stability is exhibited; and dichromateit is a noxious heavy metal salt, so the waste fluid processing be very complicated.

In particular, in recent years, environmental issues are pointed out more strongly than ever before, it is imperative to develop a non-chrome based water-soluble photosensitive resin composition free-from any chrome-based compound, instead of a conventional chrome-based water-soluble photosensitive resin composition containing a noxious heavy metal.

Various kinds of non-chrome based photosensitive resin compositions have been proposed until now.

The typical non-chrome based photosensitive resin compositions used as masks for etching use include (i) a casein-based photosensitive resin composition, (ii) a polyvinyl alcohol-based (PVA) photosensitive resin composition, and (iii) a photosensitive composition obtained by a ring-opening addition between a carboxyl of the side chain of a polymer or an oligomer and an epoxy-containing compound having ethylenic double bonds to introduce the ethylenic double bonds into the side chain of the polymer (oligomer).

Examples of the casein-based photosensitive resin composition described in item (i) above include a composition comprising casein and an azide compound (disclosed in JP-41-7100B), a composition comprising casein, an azide graft polymer, and naphthoquinone diazide sodium sulfonate (disclosed in JP-7-244374A and JP-8-34898A), and a compound prepared by adding organic acid calcium to a composition comprising casein and a water-soluble photosensitive material (disclosed in JP-11-119420A). However, casein tends to be perishable, therefore it should be carefully managed. Casein is coordinated with phosphor to form gel, it is not suitable for a photoresist for phosphor slurry.

Examples of the PVA-based photosensitive resin composition described in item (ii) above include a composition prepared by graft-copolymerizing PVA and vinyl monomer or carrying out addition reaction of glycidyl methacrylate into PVA, followed by adding a photosensitive component such as a tetrazonium salt, a diazo compound, or a diazo resin into the prepared PVA-based resin (disclosed in JP-44-28725B), a composition obtained by reacting PVA with a styryl pyridinium salt containing a formyl (disclosed in JP-55-23163A), and a composition comprising PVA and a condensed diazonium salt (disclosed in JP-56-42859B). However, each of these compositions is inferior to water resistance because of having hydroxyl groups in its PVA structure each. Such a composition in which a high proportion of an aromatic compound is contained, such as a diazide compound, a diazo resin, or a styryl pyridinium salt, is unsuitable for a phosphor slurry, because in ashing process for burning the photoresist off, a large amount of tarry fraction will remain at temperatures of about 400° C. without being burned off.

Proposed examples of the composition described in item (iii) have an excellent resistance to etching, and are disclosed in JP-47-19901A, JP-48-74594A, JP-49-37701A, JP-54-12331B, JP-3-172301A, JP-9-80748A, and JP-2000-221678A.

The composition disclosed in JP-54-12331B is only of a combination of a water-soluble polymer having ethylenic double bonds in its side chain and any one selected from an anthraquinone sulfonic acid, an anthraquinone carboxylic acid and salts thereof. It is insufficient in terms of water resistance for the formation of highly minute patterns required in recent years.

Each of the compositions disclosed in JP-47-19901A, JP-48-74594A, JP-3-172301A, and JP-2000-221678A is a water-soluble alkaline composition, while the one disclosed in JP-9-80748A is an emulsion type water-soluble alkaline composition. These compositions are not completely water-soluble, and are not suitable for the development with water. In the above compositions, water-insoluble compounds are selected as the respective photopolymerizable compounds. This is because a water-insoluble photopolymerizable compound (soluble in an organic solvent) has an excellent property of water resistance after subjected to photo-induced insolubilization, compared to that of a water-soluble photopolymerizable compound. The use of the photopolymerizable compound being soluble in an organic solvent, however, may cause the problem that the compound partially separate and float on the surface of a developer in a tank after the development, thereby to give off a bad smell, which result in environment deterioration and increasing the risk of inflammability.

JP-49-37701A discloses a technology of water-solublization of a polymer or an oligomer through the reaction of a carboxyl remained in the side chain thereof with a photopolymerizable monomer to make the compound into a water-soluble quaternary ammonium salt. As the photopolymerizable monomer, N-vinyl pyrrolidone, n-butoxymethylol acrylamide, and isobutoxymethylol acrylamide are exemplified. As N-vinyl pyrrolidone is a water-soluble monofunctional monomer, polyvinyl pyrrolidone generated after the photopolymerization is also water-soluble, and the resulting pattern would be of inferior water resistance. As n-butoxymethylol acrylamide and isobutoxymethylol acrylamide are water-insoluble, even if these compounds can be dissolved in the composition, they precipitate and liberate in a developer in a tank after the development. It would entail difficulties of wasting fluid disposal associated with the use of those compounds.

Additional technologies have been disclosed in other documents. For instance, JP-56-20541B discloses a technology for making a PVA-based resist into a cured film using an iodine-containing solution. JP-57-23254B and JP-57-24905B disclose technologies for the formation of a cured film using a titanium compound after patterning with PVA and a diazo compound. However, none of these technologies can provide sufficient properties in a practical level in terms of sensitivity, resolution, etching resistance, and the like.

Thus, with the current state of the art, chrome-based water-soluble photosensitive resin compositions including casein/chrome-based and PVA/chrome-based ones are still used as a photo mask for etching use in operating conditions on production lines. Since the chrome-based compounds have excellent photosensitivities, etching resistance, and water resistance, alternative materials have been hardly found.

Examples of such a non-chrome based photosensitive resin composition to be used for phosphor patterning include a composition obtained by reacting PVA with acrolein (disclosed in JP-6-202316A), a composition comprising an acid-generating agent, and an acid cross-linkable polymer or an acid decomposable polymer (disclosed in JP-8-146598A), a composition obtained by reacting PVA with dialdehyde, dimethylol, and dialkoxy compounds and adding an acid-generating agent to the reaction product (disclosed in JP-9-319079A), a composition obtained from an ethylene-denatured PVA (disclosed in JP-10-10722A), and a composition obtained by adding an azide compound to poly(N-vinyl acetamide) (disclosed in JP-11-24241A). In addition to these compositions, non-chrome based photosensitive resin compositions for patterning are disclosed in JP-61-158861A, JP-63-64953A, JP-2-25847A, JP-8-50811A, JP-8-315637A, JP-8-227153A, JP-8-315634A, JP-10-83077A, and JP-11-84646A.

Under present circumstances, however, in the case of the photosensitive resin compositions for the phosphor patterning, PVA/chrome-based water-soluble photosensitive resin compositions are still used in operating conditions on production lines just as in the case with the above-mentioned photosensitive resin compositions for the metal etching.

The water-soluble photosensitive resin composition is inevitably subjected to a water development process for the formation of fine patterns. In particular, there is a need to form an ultra fine-pattern on the order of microns or less in the formation of CRT shadow mask pattern, the formation of mask pattern for metal-substrate etching in the process of manufacturing a lead frame for the mounting of IC chips, or the phosphor patterning of CRT. When the pattern formation is performed at such an ultra fine level, the pattern-swelling phenomenon with water becomes more remarkable, and hence, the deformation of pattern and the decrease in resolution tend to occur. Therefore, in addition to its water-solubility that allows water development, excellent water resistance is required to the resulting pattern (photo-cured pattern) after the irradiation of light. It can be said that the non-chrome based photosensitive resin compositions described above may have poorer water resistance as yet than those of the conventional PVA/chrome-based water-soluble photosensitive resin composition and the casein/chrome-based water-soluble photosensitive resin composition.

Furthermore, various kinds of new systems for display panels have been brought out in recent years. Such display panels include organic EL, inorganic EL, and field emission display panels in addition to liquid crystal display panels, which break down the field of CRT. Therefore, in forming mask patterns in the fabrication of a shadow mask and a phosphor patterning with the use of a newly photosensitive resin composition, it is desirable to successively use the currently possessed plant and equipment effectively for cost reduction, and to avoid to spend on new plant and equipment therefor.

The most preferable method is to replace the chrome-based water-soluble photosensitive resin composition currently used with another water-soluble photosensitive resin composition capable of being developed in water, and containing free from any chrome-based compound, as well as having anti-etching property to ferric-chloride solution and phosphor patterning property equally to those of the chrome-based water-soluble photosensitive resin composition currently used in the art. This is considered the best method that can be accepted in the manufacture line currently used.

The photosensitive resin composition also may be used for the fabrication of a solid flat photosensitive resin plate, a dry film, or the like.

The solid flat photosensitive resin plate is generally fabricated by applying the photosensitive resin composition on a polyester film, drying the applied resin to form a thick photosensitive layer in the form of a sheet on the polyester film, and then sticking the photosensitive layer side to a base made of steel, aluminum, polyester, or the like, followed by cutting it into a predetermined size. For providing the thusly fabricated solid flat photosensitive resin plate as a printing plate, firstly peeling off the polyester film (cover film) from the photosensitive resin plate, then a negative film is brought into close contact with the exposed photosensitive layer in a vacuum, followed by exposure with UV rays. Subsequently, the development with an organic solvent, alkaline water, water, or the like is performed, followed by drying and exposing to light. Consequently, the pattern formation is completed.

The dry film is generally fabricated by applying the photosensitive resin composition on a substrate such as a polyester film, drying the applied resin to form a photosensitive layer on the substrate, and laminating a protective film thereon. At the time of use, the protective film is peeled off and then a board (e.g., printed circuit board) is bonded on the exposed photosensitive film by a thermal compression bonding. Subsequently, the substrate (polyester film) is stripped off. Then, a negative mask is brought into contact with the exposed photosensitive layer, followed by exposure with UV rays. Subsequently, the development with an organic solvent, alkaline water, water, or the like is performed, followed by drying and exposing to light. Consequently, the pattern formation is completed.

The negative-type photosensitive resin, which is used for a photosensitive resin plate, a dry film, and so on in addition to the above-mentioned photo mask for etching use and phosphor patterning of CRT, basically may contain a binder polymer, a photopolymerizable compound, a photo initiator, and other additives. In particular, the water-soluble photosensitive resin composition may contain a water-soluble binder resin, a water-soluble photopolymerizable compound, a photo initiator, and other additives.

The negative-type photosensitive resin compositions currently used in the art are given their respective names "organic solvent soluble," "alkaline water soluble," "water soluble," and so on. Most of them are divided into groups by what is used as a developer for each of them.

As the organic-solvent soluble photosensitive composition contains an organic-solvent soluble binder polymer and an organic-solvent soluble photopolymerizable compound, materials to be used therefor can be chosen from a wide range of options. Thus, many useful negative-type photosensitive compositions are provided. However, the use of organic solvents causes several problems such as an increase in an amount of equipment investment in order to prevent the working environment from becoming worse, such as smelling and a risk of flammability, etc. For solving these problems, it has been shifted toward the so-called water-soluble type compositions.

Among these compositions, some ones contain organic solvents, and require alkaline solutions in the process of the development. Those compositions may cause problems such as deterioration of the working environment and environmental contamination by the release of the organic solvent into the atmosphere.

Accordingly, it has been desired to provide an entirely water-soluble composition that contains none of organic solvents and is capable of being developed with water. In the field of photosensitive resin plates, for instance, those compositions are disclosed in JP-54-3790B, JP-63-64769B, and JP-61-246742A.

However, each of the compositions described in the above-mentioned patent documents has a problem of compatibility between the water-soluble binder polymer and the photopolymerizable compound, and thus the photopolymerizable compound is also selected from water soluble ones or at least water-alcohol mixture solvent soluble ones, thereby the resultant composition is of poor water resistance even after photo-insolubilization. Such a composition is hardly used in the field of printing with aqueous paint that requires water-resistance property. The plate fabricated using such composition tends to warp by swelling under the influence of high humidity in the summer, and in the winter, contrary to that, by air-drying in the winter.

The photopolymerizable compounds that are water-soluble per se and compatibilities with water-soluble binder polymers are few in number. N-vinylpyrrolidone, glycerol mono(meth)acrylate, N-methylol (meth)acrylamide, and polyethylene glycol di(meth)acrylate (the number of ethylene oxides (EO) is about 8 or more) are exemplified as those compounds, but as described above, they have poor water resistance after photo-insolubilization.

Polyethylene glycol di(meth)acrylate, which is a typical water-soluble photopolymerizable compound, exhibits water-solubility when the number of ethylene oxides (EO) thereof is about 8 or more, but poor in water resistance. When the number of EO is less than 8, improved water resistance can be attained, however, compatibility with a water-soluble binder polymer is poor, and thus, the photopolymerizable compound (EO<8) will sweep out from the thick photosensitive resin plate, fabricated using said compound, during storage; and in the case of formation of thin photosensitive film in the process of forming photomask for etching use, the photopolymerizable compound will seep out of the surface of the photosensitive film after the steps of application and drying, resulting in providing unfavorable tackiness with the surface of the photosensitive film. This adversely makes an effect on the contact exposure method in which a mask is brought into close contact with the photosensitive film at the time of exposure, and in addition, there is another problem that an unexposed portion of the photosensitive film is not dissolved in a developer (water) in developing after the exposure and the photopolymerizable compound becomes an oily film floating on the surface of the developer.

Consequently, there is the need for a negative-type photosensitive resin composition of the entirely water-soluble type: that is, the composition per se as well as a developer for such a composition is water-soluble, and is capable of forming a photosensitive film with excellent water resistance. The realization of such a negative-type photosensitive resin composition allows a wide range of applications thereof. For example, it is expected to be used in the fields of photoresists for the phosphor patterning of CRT, etching photoresists for copper wiring patterns and IC lead frames, photosensitive resin plates, dry-film photoresists, aqueous base photosensitive paints, aqueous photosensitive adhesives, and so on.

SUMMARY OF THE INVENTION

An object of the present invention is to provide a negative-type, non-chrome based photosensitive resin composition as an alternative to the conventional chrome-based water-soluble photosensitive resin composition. In particular, such a novel non-chrome based photosensitive resin composition can broadly be applicable in the fields of photo masks for etching use in the fabrication of CRT shadow masks, and lead frames for the mounting of IC chips; phosphor patterning of CRT; and further those of photosensitive resin plates, dry films, aqueous photosensitive paints, and aqueous photosensitive adhesives. In addition, the negative-type photosensitive resin composition of the present invention has water resistance as well as water-solubility, and produce effects of enduring acidic wet-etching and repetitive development in the three-color(R, G, and B) phosphor patterning process.

The present inventors eventually have found that a negative-type photosensitive resin composition comprising a product of the Michael addition reaction between a specific amino group-containing compound and a specific polyethyleneglycol (meth)acrylate could solve the above problems, and have completed the present invention.

The present inventors have also found that a negative-type photosensitive resin composition comprising a secondary product of the Michael addition reaction between the product of the Michael addition reaction and an organic silicon compound exhibited extremely excellent water resistance.

According to one aspect of the present invention, there is provided a negative-type photosensitive resin composition comprising component (A) which is a product of the Michael addition reaction between an amino group-containing compound (a-1) represented by the general formula (I):

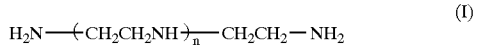

wherein n is an integral number of 1–4, and
a polyethyleneglycol di(meth)acrylate (a-2) represented by the general formula (II):

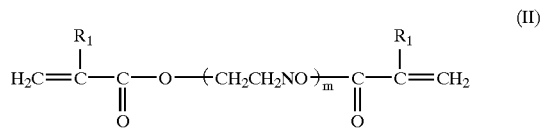

wherein $R_1$ is a hydrogen or a methyl, and m is an integral number of 4–14.

According to another aspect of the present invention, there is provided a product of the Michael addition reaction to be used in the preparation of a negative-type photosensitive resin composition, wherein the product is obtained by the Michael addition reaction between an amino group-containing compound (a-1) represented by the general formula (I):

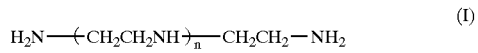

wherein n is an integral number of 1–4, and
a polyethyleneglycol di(meth)acrylate (a-2) represented by the general formula (II):

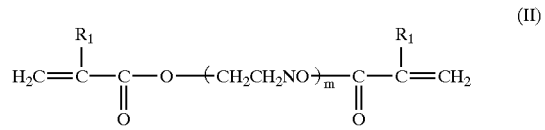

wherein $R_1$ is a hydrogen or a methyl, and m is an integral number of 4–14.

DETAILED DESCRIPTION OF THE INVENTION

Component (A) to be used in the present invention is a reaction product obtained by the Michael addition reaction between an amino group-containing compound (a-1) represented by the following general formula (I):

wherein n is an integral number of 1–4, and a polyethyleneglycol di(meth)acrylate (a-2) represented by the following general formula (II):

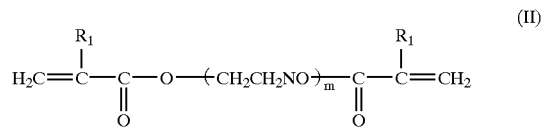

wherein $R_1$ is a hydrogen or a methyl, and m is an integral number of 4–14.

Component (a-1) is a compound that contains a primary amino group or a secondary amino group. Examples thereof include diethylenetriamine, triethylenetetramine, tetraethylenepentamine, and pentaetlylenehexamine. Component (a-1) may be used singly or in a combination of two or more thereof. Component (a-1) is commercially available, such as in the name of "Heavy Polyamine X" (manufactured by Union Carbide Corporation).

Component (a-2) is of the general formula (II) with m=4 to 14, where the number of ethylene oxides (EO) is in the range of 4 to 14, preferably with m=4 to 9, and more preferably m=4 to 6. The use of component (a-2) with the number of EO within the above range allows component (A), prepared as a product of the Michael addition reaction, exhibit advantageous effects in its favorable water resistance after the photopolymerization and favorable water-solubility.

Furthermore, it exhibits a more excellent effect on the increase in water resistance when as component (A) is used a reaction product (a secondary product of the Michael addition reaction) obtained by the Michael addition reaction of an organic silicon compound (a-3) that contains an amino group and/or an imino group with the product of the Michael addition reaction between component (a-1) and component (a-2).

The Michael addition reaction with the addition of another component (a-3) may be carried out after preparing the product of the Michael addition reaction between component (a-1) and component (a-2). Alternatively, the Michael addition reaction may take place by mixing component (a-3) together with components (a-1) and (a-2) at the time of the Michael addition reaction between components (a-1) and (a-2).

Preferably, component (a-3) may be a compound represented by the following general formula (III):

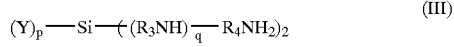
(III)

wherein Y is an alkyl or an alkoxy each having 1–3 carbon atoms, $R_3$ and $R_4$ independently represent a divalent hydrocarbon group having 1–5 carbon atoms, p is an integral number of 0–3, and q is an integral number of 1–3. Two or more Y may be identical or different when p is 2 or 3, while two or more $R_3$ may be identical or different when q is 2 or 3.

Here, the term "hydrocarbon group" means a group made up of carbon atoms and hydrogen atoms, which may be an aliphatic hydrocarbon group, an alicyclic hydrocarbon group, or an aromatic hydrocarbon group. In the hydrocarbon group, the carbon atom may be substituted or unsubstituted. Preferably, the "divalent hydrocarbon group" may be an alkylene in particular. The alkylene may be of straight chain or branched chain, and in particular, a straight-chain alkylene is preferable.

The compounds represented by the general formula (III) may be preferably one of the compounds having the following general formulae (IV), (V), and (VI):

(IV)

(V)

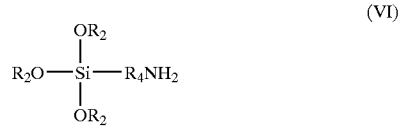
(VI)

wherein $R_2$ is an alkyl having 1–3 carbon atoms, and $R_3$ and $R_4$ are the same as defined above.

Examples of such an organic silicon compound include N-β(aminoethyl)γ-aminopropyltrimethoxysilane, N-β(aminoethyl)γ-aminopropylmethyldimethoxysilane, and γ-aminopropyltriethoxysilane. They are commercially available as "KBM603," "KBM602," and "KBE903" (each of them is a silane-coupling agent manufactured by Shin-Etsu Chemical Co., Ltd.). Among them, N-β(aminoethyl)γ-aminopropyltrimethoxysilane ("KBM603") is most preferable because even in a small amount of the compound the addition of allows the improvement of water resistance.

In the present invention, the Michael addition reaction may proceed in the stages as represented by the following reaction formula. Various kinds of by-products may be obtained depending on the diversity of the addition reaction, the positions of the amino groups, imino groups or the like contained in components (a-1) and (a-3).

In the following reaction formula, the amino group-containing compound represented by the general formula (I) is alternatively represented by the following formula:

and the polyethyleneglycol di(meth)acrylate represented by the formula (II) is alternatively represented by the following formula.

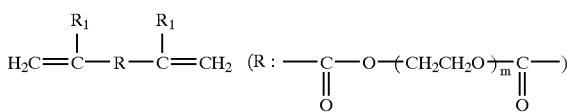

Michael addition reaction between components (a-1) and (a-2):

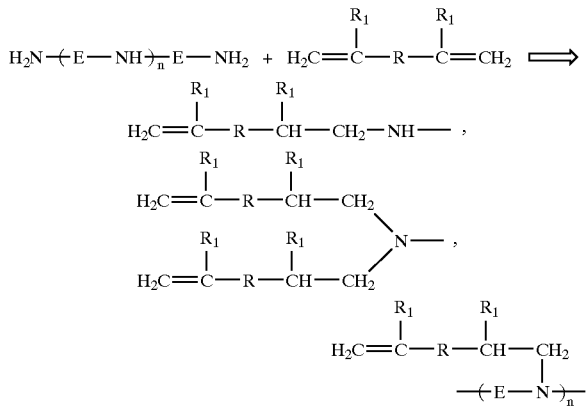

It is conceivable that the product having the following general formula (X) may be prepared by the Michael addition reaction:

(X)

wherein Z is a hydrogen or a group represented by the following formula:

wherein $R_1$ is a hydrogen or a methyl; n is an integral number of 1–4, and E and R are respectively the same as defined above.

Accordingly, the Michael addition reaction between components (a-1) and (a-2) allows a part of terminal ethylenic unsaturated double bonds of component (a-2) to be cross-linked with component (a-1), resulting in the increase in water resistance. In the Michael addition reaction with the addition of component (a-3), the product may be prepared by the Michael addition reaction between the ethylenic unsaturated double bond remained in the molecular structure of the general formula (X) and the amino group or the imino group in component (a-3), resulting in a further increase in water resistance.

The reaction product obtained by the Michael addition reaction is excellent in water solubility.

That is, when the number of ethylene oxides (EO) in the general formula (II) is in the range of about 4–6, component (a-2) per se is insoluble, however, the reaction product prepared by the Michael addition reaction using component (a-2) is water-soluble. Actually, at an early stage of the Michael addition reaction, the reaction solution is hardly dissolved in water and an oil film is formed on the water surface. However, as the reaction proceeds, the reaction solution becomes water-soluble. It is considered that, as ethylene oxide (EO) is a water-soluble group, the product becomes water-soluble due to the increasing number of ethylene oxides in the molecule of the reaction product as the addition reaction proceeds.

The negative-type photosensitive resin composition of the present invention including component (A), which is the product of the Michael addition reaction between components (a-1) and (a-2), is superior to a photosensitive resin composition that does not contain the said product of the Michael addition reaction, but contain component (a-2), in the compatibility of the composition. In addition, the water resistance of a film prepared by photo-polymerization of the former composition of the present invention is almost the same as or superior to that of the latter. This fact has been confirmed by: the comparison between the photosensitive resin composition, that contains a product of the Michael addition reaction between polyethyleneglycol diacrylate (EO=4) and tetraethylenepentamine, and the composition, that does not contain the said product of the Michael addition reaction, but contain polyethyleneglycol acrylate (EO=4); the comparison between a photosensitive resin composition, that contains a product of the Michael addition reaction between polyethyleneglycol diacrylate (EO=9) and tetraethylenepentamine, and a composition that does not contain the said product of the Michael addition reaction, but contain polyethyleneglycol acrylate (EO=9).

In order to control the water solubility of component (A), it is preferred to carry out the reaction using two or more components (a-2) each having different numbers of ethylene oxides. Component (A) that has more excellent water solubility as well as water resistance was obtained by preparing component (a-2) as a mixture of two different components (a-2) where one was of EO=4 and the other was of EO=6 at a mixing ratio of 7:3 (mass ratio), compared with those of component (A) using a single component (a-2) having four ethylene oxides (EO=4).

There is an amino group-containing compound having a structure different from that of the general formula (I), such as hexamethylene diamine. A reaction product obtained by the Michael addition reaction between the said compound and the mixture of two different components (a-2) where one was of EO=4 and the other was of EO=6 at a mixing ratio of 7:3 (mass ratio) was unsolved in water, and hence could not exhibit excellency in water solubility.

It is noteworthy that component (a-2) per se has a smell of ester and is unfavorable in the working environment, however, component (A), the product of the Michael addition reaction using component (a-2), has little smell of ester, and is favorable in the working environment.

The Michael addition reaction in the present invention is the one between an ethylenic unsaturated double bond of component (a-2) as a bifunctional monomer and component (a-1) ("polyvalent amino compound") as a compound that contains two amino groups and 1–4 imino groups, there is the fear of gellation depending on the reaction method.

That is to say, on the addition of a small amount of component (a-2) or a bifunctional monomer, into component (a-1) or a polyvalent amino compound, thereby to allow react both two functional groups of compound (a-2), the resultant product is instantaneously gelled and insolubilized. On the other hand, in the case of the addition of component (a-1) into component (a-2), a rapid and massive addition of component (a-1) make the resultant product is instantaneously gelled and insolubilized.

If the concentration of the reaction solution is too high, the reaction proceeds rapidly and forms many cross-linking points, and the reaction solution is apt to be gelled. If the concentration of the reaction solution is too low, the reaction hardly proceeds.

Thus, in order to prevent the gelation, it is preferred that only one of the ethylenic unsaturated double bonds in component (a-2) be subjected to the reaction, while the other be remained as it is. For performing such reaction, it is important to attain the conditions in which (i) component (a-1) diluted with the solvent is added in a dropwise manner into component (a-2), (ii) a charging molar ratio between component (a-2) and component (a-1) is controlled, and so on.

In the condition (i) above, it is preferred that component (a-1) be dissolved in a water-soluble solvent, that does not react with component (a-1), has compatibilities with components (a-1) and (a-2), and has a boiling point of 64–200° C., thereby to obtain a solution with a concentration of 5–30% by mass, preferably 10–20% by mass, and add the solution into component (a-2) in a dropwise manner while stirring slowly.

In the condition (ii), if the charging amount of component (a-2) relative to component (a-1) is too small, gelation is apt to occur, thus the components preferably be charged at a ratio of component (a-2)/component (a-1)=4.5 or more (molar ratio). When the ratio is 4.5 or more, gelation does not occur. If the ratio is more than 15, water resistance and water solubility tend to be lowered. The molar ratio is preferably in the range of 4.5-15.

As the Michael addition reaction proceeds sufficiently at temperatures 0–100° C., preferably 70–100° C., even in the absence of catalyst, any catalyst is not essentially required in the reaction, but it may be used if desired. Examples of such a catalyst include alcoholates of alkaline metals, organic metal compounds, metal hydroxides, and tertiary amines. A preferable reaction time is about 1–10 hours, more preferably about 3–7 hours.

The reaction solvent to be used in the Michael addition reaction may be preferably a water-soluble solvent that does not react with raw materials, such as components (a-1) and (a-2), while being capable of uniformly dissolving these raw materials.

In the case that component (a-2) is a water-insoluble compound (e.g., the number of EO of the compound is about 4–6), water is not suitable for using as a solvent in the reaction because the reaction proceeds unevenly and tends to cause a gelled product. A halogen based solvent, and a solvent containing a carboxyl, a carbonyl or the like are not suitable as they react with the amino group and/or the imino group in component (a-1). A solvent containing an amino group or an imino group is not suitable as it reacts with the unsaturated double bonds in component (a-2).

The Michael addition reaction itself proceeds even if the solvent is of ester or petroleum. However, for the purpose of preparing a water-soluble photosensitive resin composition, it is not preferable of the contamination a water-insoluble solvent in a negative-type photosensitive resin composition, a final product of the reaction. Therefore, it is preferred to avoid the use of any water-insoluble solvents.

Consequently, examples of the preferably usable reaction solvent may include methyl alcohol, ethyl alcohol, propyl alcohol, isopropyl alcohol, tert-butyl alcohol, N-methyl pyrrolidone, ε-caprolactam, ethylene glycol, ethyleneglycol monomethylether, ethyleneglycol monoethylether, ethyleneglycol monoacetate, ethyleneglycol monomethylether acetate, 2-(methoxymethoxy)ethanol, 2-isopropoxyethanol, 2-isopentyloxyethanol, 2-butoxyethanol, furfuryl alcohol, tetrahydrofurfuryl alcohol, tetrahydrofuran, diethyleneglycol monomethylether, diethyleneglycol monoethylether, diethyleneglycol monobutylether, triethylene glycol, tryethyleneglycol monomethylether, propyleneglycol monomethylether, propyleneglycol monoethylether, dipropyleneglycol monomethylether, dipropyleneglycol monoethylether, glycerin ethers, glycerin monoacetate, diethyleneglycol dimethylether, diethyleneglycol diethylether, tetrahydropyran, trioxane, dioxane, 1,2,6-hexantriol, 2-methyl-2,4-pentandiol, 2-butene-1,4-diol, 2,3-butanediol, 1,3-butandiol, 1,3-propanediol, 1,2-propandiol, propargyl alcohol, N,N-dimethyl ethanolamine, N,N-diethyl ethanolamine, N-ethyl morpholine, methyl lactate, and ethyl lactate.

The reaction solvent may appropriately be selected from the above-listed compounds with reference to its use object. A solvent having a low boiling point is preferably used for the fabrication of a photosensitive resin plate, or a dry film, as such a fabrication process includes applying a photosensitive resin composition in the form of a sheet on a substrate, thereby to make a thick coating film, and drying the thick film.

In forming a comparatively thin photosensitive film, such as phosphor patterning or forming photoresist patterns for etching use in the fabrication of CRT, the uniformity of the coating film tends to be impaired if is used a solvent having a low boiling point. A solvent having a comparatively high boiling point is preferable in such a process, however, a solvent having an excessively high boiling point is not preferred because of its tendency to be remained in the coating film.

Consequently, it is preferred to select a solvent having such an appropriate boiling point that meets use objects as well as conditions of applications. In general, it may be appropriately selected from those having their respective boiling points ranging preferably 64-200° C., more preferably 100-200° C.

For selecting an appropriate solvent, furthermore, there is a need of considering environmental sanitation issues such as toxicity.

The Michael addition reaction itself has been known in the art from a long ago. For instance, JP-60-190427A, JP-7-8908A, JP-63-162660A, and JP-7-331179A disclose the compositions prepared using the Michael addition reaction. However, it has not been proposed at all until now as to obtain component (A) in the present invention by utilizing the Michael addition reaction, and furthermore to obtain a negative-type photosensitive resin composition having excellent water solubility and water resistance by using component (A).

In the Michael addition reaction in the present invention, component (a-2) is preferably used together with a thermal polymerization inhibitor. Examples of such a thermal polymerization inhibitor include quinone derivatives such as hydroquinone, methyl hydroquinone, and p-benzoquinone; phenol derivatives such as 2,6-di-tert-butyl-p-cresol; and others known in the art.

In the case of obtaining the product of the Michael addition reaction with the addition of component (a-3), it is preferred to first dissolve the product of the Michael addition reaction between components (a-1) and (a-2) in a solvent having a compatibility therewith to prepare a solution, followed by adding a solution of component (a-3) thereinto in a dropwise manner.

The solution of component (a-3) is preferably prepared by using a solvent that does not react with component (a-3). The concentration of the solution is preferably about 3–30% by mass, particularly about 10–20% by mass. If the concentration thereof is too low, the reaction hardly proceeds.

If the total amount of component (a-3) to be charged is added at once or massively, the reaction proceeds so rapidly that on some occasions the product is gelled. Therefore, it is preferred to add the solution of component (a-3) slowly and carefully in a dropwise manner.

The Michael addition reaction sufficiently proceeds even in the absence of a catalyst at a temperature of 0–100° C., preferably 70–100° C. Therefore, there is no need of any catalyst in particular. However, it may be added if desired. Examples of such a catalyst include alcoholates of alkaline metals, organic metal compounds, metal hydroxides, and tertiary amines.

In the Michael addition reaction, various kinds of by-products may be obtained depending on the diversity of the addition reaction, the positions of amino groups, imino groups or the like contained in the silane compound to be used.

The negative-type photosensitive resin composition of the present invention has extremely excellent characteristics of, in spite of being water soluble, being excellent in film water resistance, due to the incorporation of component (A). In addition to component (A), the negative-type photosensitive resin composition further includes a binder polymer as component (B), and a photopolymerization initiator as component (C).

The binder polymer as component (B) may be used any polymer insofar as being compatible with component (A), such as water-soluble binder polymer, alkaline water-soluble binder polymer, or an organic solvent-soluble binder polymer.

For the purpose of preparing a water-soluble photosensitive resin composition, component (B) per se may also be soluble in water. Examples of such a binder polymer include partially-saponified vinyl acetate resin and derivatives thereof, cellulose resins, polyvinyl pyrrolidone, polyacryl resins, water-soluble resins having double bonds on its side chain, water-soluble resins in which double bonds on its side chain have been reacted with an amino group-containing silane compound by the Michael addition reaction, alkyd resin, polyethylene oxide, water-soluble polyamides having a sulfonate group and a basic group, and other various water-soluble resins.

Among them, the water-soluble resins in which double bonds on its side chain have been reacted with an amino group-containing silane compound by the Michael addition reaction is preferable. Preferred such a binder polymer includes a polymer obtained by the Michael addition reaction between a polymer (b-1) having a structural unit represented by the following general formula (VII):

the polymer having the structural unit represented by the general formula (VII):

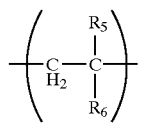
(VII)

wherein $R_5$ is a hydrogen or a methyl, $R_6$ is a substituted or unsubstituted hydrocarbon group having an unsaturated double bond capable of being subjected to the Michael addition reaction, wherein the hydrocarbon group may include at least one group selected from the following groups in its structure:

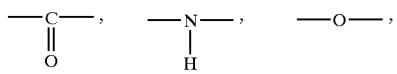

and an organic silicon compound (b-2) containing an amino group and/or an imino group described below.

Component (B) may be selected from those of soluble in water, alkaline water, or an organic solvent. The solubility of component (B) can appropriately be adjusted by selecting repetitive units that make up component (b-1), the reaction ratio of component (b-2), and so on.

The "hydrocarbon group" in the general formula (VII) is a group consisting of hydrogen atoms and carbon atoms, however, in component (b-1) in the present invention, it may include each of three groups (a carbonyl, an imino group, and an ethereal oxygen atom) as described above. Either of an aromatic hydrocarbon group and an aliphatic hydrocarbon group may be used as the hydrocarbon group. Among them, the aliphatic hydrocarbon group is preferable.

The "double bond capable of being subjected to the Michael addition reaction" is preferably an ethylenic double bond.

The structural unit represented by the general formula (VII) is preferably one represented by the following general formula (XI):

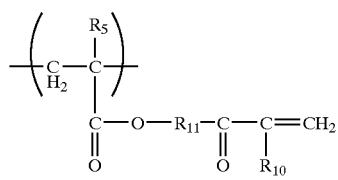
(XI)

wherein each of $R_5$ and $R_{10}$ independently represents a hydrogen or a methyl, and $R_{11}$ is a divalent hydrocarbon group in which a hydroxyl group may be substituted, wherein the hydrocarbon group may include at least one group selected from the following groups in its structure:

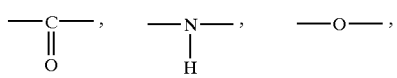

Furthermore, from the point of improving water solubility, in the general formula (XI), it is preferred that $R_5$ and $R_{10}$ each represent a methyl, and $R_{11}$ represents —$CH_2CH(OH)CH_2O$— or —$R_{12}OCONH$—, wherein $R_{12}$ is a divalent saturated hydrocarbon group having 2-4 carbon atoms. In particular, $R_{12}$ may preferably be —$C_3H_6$—.

Component (b-1) may preferably have a structural unit represented by the following formula (XII), in addition to the polymer having the structural unit represented by the general formula (VII):

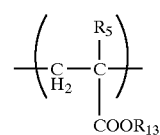
(XII)

wherein $R_5$ is the same as defined above, $R_{13}$ is a hydrogen, or a hydrocarbon group in which a hydroxyl group is substituted, wherein that the hydrocarbon group may include one selected from the following groups in its structure:

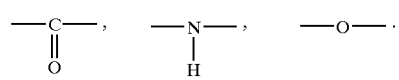

This indicates that the structural unit represented by the general formula (XII) is remained in component (B) when component (B) is prepared by the Michael addition reaction between components (b-1) and (b-2). Introducing the structural unit into component (B) may control the characteristics of component (B) (i.e., water solubility, alkaline water solubility, organic solvent solubility, and so on).

In the general formula (XII), it is preferred that $R_5$ be a methyl, $R_{12}$ be a hydrogen or —$R_{14}OH$, wherein $R_{14}$ is a divalent saturated hydrocarbon group having 2-4 carbons.

Examples of component (b-1) include:

(i) a compound produced by a ring-opening addition reaction between a polymer having a carboxyl group on its side chain and an epoxy-containing compound having the ethylenic double bond in its molecular structure, thereby introduced the ethylenic double bond into the side chain of the polymer;

(ii) a compound produced by a reaction between a polymer having a hydroxyl group on its side chain and an isocyanate-containing compound having the ethylenic double bond in its molecular structure, thereby introduced the ethylenic double bond into the side chain of the polymer; and (iii) a compound produced by an esterification reaction between a polymer having a hydroxyl group on its side chain and an carboxyl group-containing compound having the ethylenic double bond in its molecular structure, thereby introduced the ethylenic double bond into the side chain of the polymer.

In item (i) above, the polymer having a carboxyl group on its side chain may be a homopolymer of (meth)acrylic acid, a copolymer of (meth)acrylic acid and a monomer (comonomer) copolymerizable therewith. Examples of the monomer (comonomer) include maleic acid, itaconic acid, (meth)acrylate compounds (e.g., methyl (meth)acrylate, ethyl (meth)acrylate, butyl (meth)acrylate, 2-ethylhexyl (meth)acrylate, 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-(meth)acryloyloxy-2-hydroxypropyl phthalate, glycerin mono(meth)acrylate, tetrahydrofurfuryl (meth)acrylate, dimethylamino(meth)acrylate, glycidyl (meth)acrylate, 2,2, 2-trifluoroethyl (meth)acrylate, and 2,2,3,3-tetrafluoropropyl (meth)acrylate), (meth)acrylate half esters of phthalic acid derivatives, styrene, methylvinyl ether, acrylonitrile, and N-methylol (meth)acrylate. The polymer can easily be prepared by well-known radical polymerization reaction using one or more monomers (copolymers)

selected from these monomers. The physical properties of the polymer can easily be controlled by the selection of the monomers at will to obtain the desired polymer.

Examples of such an epoxy-containing compound having an ethylenic double bond in its molecular structure include alicyclic epoxy-containing unsaturated compounds such as glycidyl acrylate, glycidyl methacrylate, allylglycidyl ether, α-ethylglycidyl ether, crotonylglycidyl ether, itaconic acid monoalkyl ester monoglycidyl ester, and 3,4-epoxycyclohexyl methyl(meth)acrylate. These compounds may be used singly or in a combination of two or more thereof.

The amount of the epoxy-containing compound to be added is preferably about 10–50% by mole, more preferably about 25–30% by mole with respect to the total amount of the polymer having the carboxyl on its side chain. If the amount of the epoxy-containing compound is too small, the etching resistance tends to be decreased due to poor photocuring of the photosensitive resin composition. If it is too much, on the other hand, it tends to cause poor exposure, water-insolubilization due to an increase in tackiness of the coating surface of the photosensitive resin composition.

The ring-opening addition reaction between the polymer having a carboxyl group on its side chain and the epoxy-containing compound having a double bond in its molecular structure may be conducted by mixing the polymer, the epoxy-containing compound, a catalyst, and a thermal polymerization inhibitor together and stirring the mixture while heating at temperatures of 50–100° C. for about 5–20 hours. If the temperature is too high, it causes the decrease in heat stabilities of various raw materials.

Examples of such a catalyst include tertiary amines such as trimethylamine, triethylamine, and benzyldimethylamine, and quaternary ammonium salts such as triethylammonium chloride, benzyltrimethylammonium bromide, and benzyltrimethylammonium iodide. The amount of the catalyst may be preferably about 0.1–10% by mass with respect to the total amount of the reaction mixture of raw materials.

Examples of such a thermal polymerization inhibitor include hydroquinone, methyl hydroquinone, hydroquinone monomethylether, catechol, tertiary butylcatechol, and pyrogallol. The amount of the thermal polymerization inhibitor may preferably be in the range of about 0.01–1% by mass with respect to the total amount of the reaction mixture of raw materials.

In item (ii) above, examples of the polymer having a hydroxyl group on its side chain include a homopolymer or a copolymer prepared using one or more compounds having a hydroxyl group such as 2-hydroxyethyl (meth)acrylate, 2-hydroxypropyl (meth)acrylate, 2-hydroxybutyl (meth)acrylate, and 2-phenoxy-2-hydroxypropyl (meth)acrylate, or a copolymer between at least one of these compounds and a monomer (or comonomer) copolymerizable therewith. Here, the comonomer to be used include, for example, comonomers exemplified in the above compound (i). The polymer having a hydroxyl group on its side chain can easily be prepared by well-known radical polymerization reaction using one or more various monomers (comonomers) described above. The physical properties of the polymer may easily be controlled by optionally choosing monomers above, thereby to obtain the desired polymer meets the use object.

As the isocyanate-containing compound having a double bond in its molecular structure, methacryloyl isocyanate is exemplified.

In item (iii) above, the polymer having a hydroxyl group on its side chain may be selected from those described in item (ii). The carboxyl group-containing compound having a double bond in its molecular structure include (meth)acrylic acid, or maleic anhydride.

For preparing component (b-1), the methods are described in items (i)–(iii) above, but are not limited thereto. The polymer prepared by the method described in item (i) is most preferable for the purpose of preparing a water-soluble photosensitive resin composition.

A compound produced by a ring-opening addition reaction between a polymer having an epoxy group on its side chain and a carboxyl group-containing compound having a ethylenic double bond in its molecular structure, thereby introduced the ethylenic double bond into the side chain of the polymer (e.g. a reaction product between polyvinyl glycidyl ester and (meth)acrylic acid, a reaction product between an epoxy-containing acrylic polymer and (meth)acrylic acid, a reaction product between a novolac epoxy resin and (meth)acrylic acid, and a reaction product between an epoxy resin having an alicyclic epoxy and (meth)acrylic acid) has often remained epoxy group therein, and is not preferable.

As component (b-2), the same compound as the one represented by the above general formula (III) (wherein Y, $R_3$, $R_4$, p, and q are respectively the same as defined above) is preferably used. That is, component (b-2) may be preferably selected from the same compounds as those that are preferably used as component (a-3). Component (b-2) may be more preferably selected from the compounds represented by the above general formulae (IV), (V), and (VI) (wherein $R_2$, $R_3$, and $R_4$ are respectively the same as defined above).

In the Michael addition reaction between components (b-1) and (b-2), it is preferred that component (b-1) be dissolved in a solvent having compatibility therewith to prepare a polymer solution, and then adding a solution of component (b-2) in a dropwise manner thereinto.

The solution of component (b-2) is preferably prepared using a solvent that does not react with component (b-2). The concentration of a solution of component (b-2) is preferably about 5–30% by mass, more preferably about 10–20% by mass. If the concentration of the solution is too low, the reaction hardly proceeds.

If the total amount of component (b-2) to be charged is added at once or massively, the reaction proceeds so rapidly that on some occasions the product (polymer) is gelled. Therefore, it is preferred to add the solution of component (b-2) slowly and in a dropwise manner.

The Michael addition reaction between components (b-1) and (b-2) sufficiently proceeds even in the absence of a catalyst at a temperature of 0–100° C., preferably 70–100° C. Therefore, there is no need of any catalyst in particular. However, it may be added if desired. Examples of such a catalyst include alcoholates of alkaline metals, organic metal compounds, metal hydroxides, and tertiary amines.

The reaction formula of the Michael addition reaction between components (b-1) and (b-2) is may be simply illustrated as follows. The Michael addition reaction may proceed mainly as the following reaction formula, however, various kinds of the products may be caused as by-products depending on the positions of the amino group and/or the imino group in the silane compound to be used, and the diversity of the addition reaction.

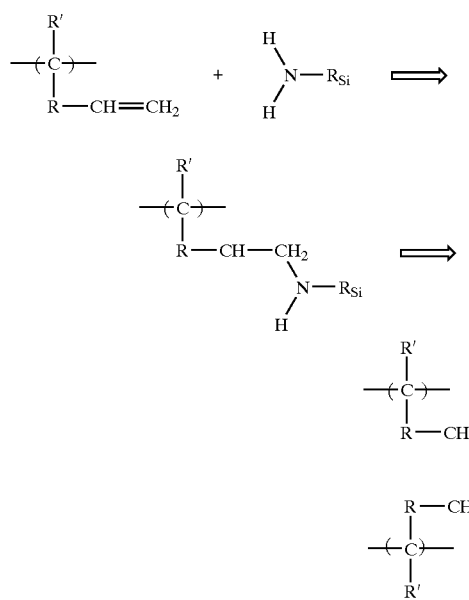

In component (B), a part of the ethylenic double bond in the polymer's side chain of component (b-1) is cross-linked with component (b-2) by conducting the Michael reaction between components (b-1) and (b-2), resulting in the improvement in water resistance. Component (B) becomes a partially cross-linked polymer without gelation by partial cross-linking reaction between the backbone chains of the polymers, which is accompanied with the Michael addition reaction.

Component (B) can be prepared as one of water-soluble, alkaline water-soluble, and organic solvent-soluble polymers by appropriately selecting the variety, the mixing amount, and so on of various kinds of raw materials such as monomers (comonomers) as described above in items (i)–(iii), epoxy-containing compounds, isocyanate group-containing compounds, carboxyl-containing compounds, and organic silicon compounds.

Furthermore, using the above polymer makes it possible to prepare each of a water-soluble photosensitive resin composition, an alkaline-soluble photosensitive resin composition, and an organic solvent soluble photosensitive resin composition. The above polymer is particularly suitable for preparing the water-soluble photosensitive resin composition, and said water-soluble photosensitive resin composition using such a polymer exhibits outstanding water resistance as well as etching resistance.

These polymers may be used singly or as a combination of two or more thereof.

The photopolymerization initiator as component (C) in the present invention is not limited to a specific one. Any photopolymerization initiators well known in the art may be used. Example of such a photopolymerization initiator include benzophenone derivatives such as benzophenone, 2,4,6-trimethyl benzophenone, 2-hydroxy-4-alkoxybenzophenone, 4,4'-bis(dimethylamino) benzophenone (i.e., Michler's ketone), 4,4'-bis (diethylamino)benzophenone, and 4-methoxy-4'-dimethylaminobenzophenone, benzoin derivatives such as benzoin, benzoin isopropylether, benzoin isomethylether, benzoin isoethylether, benzoin isobutylether, and benzoin phenylether, benzyl derivatives such as benzyl, dibenzyl, benzyldiphenyl disulfide, and benzyldimethyl ketal, xan- thone derivatives such as xanthone, thioxanthone, 2-chlorothioxanthone, 2-methylthioxanthone, 2,4-diethylthioxanthone, and 2-ethylthioxanthone, acetophenone derivatives such as acetophenone, 2,2'-diethoxyacetophenone, p-t -butyldichloroacetophenone, and 2,2'-dichloro-4-phenoxyacetophenone, anthraquinone derivatives such as chloroanthraquinone, 2-methylanthraquinone, 2-ethylanthraquinone, 2-carboxyanthraquinone, anthraquinone-2-sulfonic acid sodium salt, anthraquinone-2,6-disulfonic acid sodium salt, and anthraquinone-2,7-disulfonic acid sodium salt, acridine derivatives such as 9-phenyl acridine, and 1,7-bis (9,9'-acridinyl)heptane, phenanthrenequinone, 2,4,6-trimethylbenzoyl diphenylphosphineoxide, bis(2,4,6-trimethylbenzoyl)phenylphosphineoxide, bis(2,6-dimethoxybenzoyl)-2,4,4-trimethyl-pentylphosphineoxide, oligo[2-hydroxy-2-methyl-1-[4-(1-methylvinyl)phenyl] propanone], 1-hydroxycyclohexylphenyl ketone, 2-hydroxy-2-methyl-1-phenyl-1-propane-1-on, 2-methyl-1-[4-(methylthio)phenyl]-2-morphorinopropane-1-on, 1-[4-(2-hydroxyethoxy)phenyl]-2-hydroxy-2-methyl-1-propane-1-on, and 2-benzyl-2-dimethylamino-1-(4-morphorinophenyl)butane-1-one. Component (C) may be used singly or as a combination of two or more thereof.

For preparing the water-soluble photosensitive resin composition, water-soluble photopolymerization initiators are preferably used, but not limited thereto. Comparing with the total amount of solids in the composition, the amount of such an initiator is only a few, so that photopolymerization initiators insoluble in water can also be used in the present invention.

The negative-type photosensitive resin composition of the present invention may optionally include component (D), which is a photopolymerizable compound having at least one ethylenic unsaturated bond in the molecular structure.

Examples of component (D) include many compounds that are insoluble in water. For preparing the water-soluble photosensitive resin composition, one having an excellent compatibility with the water-soluble component (B) is preferable. Examples of component (D) include a condensate obtained by reaction between N-methylol (meth)acrylamide and urea or a urea derivative (e.g., dimethoxymethyl urea) as disclosed in JP-54-3790B, or a (meth)acrylamide methylene group-containing compound which is a condensate obtained by reaction between components (d-1) and (d-2) described below.

Among them, the (meth)acrylamide methylene group-containing compound is more preferable in terms of its water solubility. In particular, when it is combined with the above component (A), it is possible to prepare a negative-type photosensitive resin composition having a high sensitivity, which is effectively prevented from an influence of oxygen (desensitizing action). In particular, the condensate between N-methylol (meth)acrylamide and urea or a urea derivative is preferably used in the fabrication of a printing photosensitive resin plate or the like.

The above preferable compound that contains a (meth) acrylamide methylene group can be obtained by reacting compound (d-1) having at least one alcoholic hydroxyl group in its molecular structure and compound (d-2) represented by the following general formula (VIII) in the presence of a strong acid catalyst:

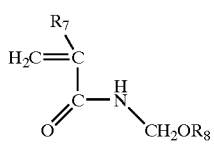

(VIII)

wherein $R_7$ is a hydrogen or a methyl, and $R_8$ is a hydrogen or an alkyl having 1–4 carbon atoms. The resulted product is represented by the general formula (IX):

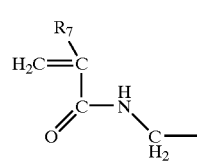

(IX)

wherein $R_7$ is the same as defined above.

Component (d-1) is preferably a non-basic compound, more preferably a polyvalent alcohol. Examples of such a polyvalent alcohol include ethylene glycol, diethyleneglycol, 1,2-propanediol, 1,3-propanediol, 1,2-butanediol, 1,3-butanediol, 1,4-butanediol, 2,3-butanediol, 2-butene-1,4-diol, 2-methyl-2,4-pentanediol, 2-ethyl-1,3-hexanediol, 1,2,6-hexanetriol, dipropyleneglycol, triethyleneglycol, tetraethyleneglycol, polyethyleneglycol, polypropyleneglycol, neopentylglycol, 1,5-pentane diol, 1,6-hexane diol, trimethylol propane, glycerine, diglycerine, polyglycerine, polyoxyethylene (n)diglyceryl ether, polyoxypropylene (n)diglyceryl ether, pentaerythritol, dipentaerythritol, tris(2-hydroxyethyl)isocyanurate, 3-chloro-1,2-propanediol, 2,2'-thiodiethanol, and poly(oxyethylene-oxypropylene) derivatives. Among them, preferable are ethylene glycol, diethyleneglycol, 1,3-propanediol, 1,4-butanediol, triethyleneglycol, 1,6-hexanediol, trimethylol propane, glycerine, pentaerythritol, and tris(2-hydroxyethyl) isocyanurate. Component (d-1) may be used singly or in a combination of two or more threreof.

Diethanol amine, N-butyldiethanol amine, triethanol amine, tri-isopropanol amine, etc., also have two or more hydroxyl groups, however, they are not preferable as each of them is of basic, so the acidic catalyzing action can be decreased. In addition, even though their systems can be shifted to acidic by an excess amount of acid catalyst, a water-absorbing action of the salts being formed provides a resulting condensate with poor water resistance after the photo-polymerization.

Examples of the compounds represented by the general formula (VIII) (where $R_7$ and $R_8$ are the same as defined above) as component (d-2) include N-methylol (meth)acrylamide, N-methoxymethyl (meth)acrylamide, N-ethoxymethyl (meth)acryalamide, N-propoxymethyl (meth)acrylamide, and N-butoxymethyl (meth)acrylamide.

The strong acid catalysts to be used in the condensation reaction between components (d-1) and (d-2) may be preferably those showing a strong acidity of about pH 3 or less during the condensation reaction. In the present invention, preferably, the strong acid catalyst may be at least one selected from sulfuric acid, hydrochloric acid, nitric acid, p-toluene sulfonic acid, and ammonium chloride. Ammonium chloride causes the evaporation of ammonia as a result of thermal degradation, and provides an acidity of hydrochloric acid. Therefore, it can be included in the group of strong acid catalysts. In the present invention, p-toluene sulfonic acid is most preferable, as it allows to prepared a compound having excellent water resistance. The strong acid catalyst may be used individually or in combinations of two or more. The amount of the strong acid catalyst is defined such that the pH value in the reaction system falls within the range described above. If the pH in the reaction system is about 4 or more, it becomes difficult to obtain a compound having excellent water resistance. The strong acid catalyst may be added just the way as it is, or it may be added the way in the form of a solution dissolved in a solvent. However, as the condensation reaction proceeds by dehydration or dealcoholization reaction, the solvent may be preferably one except water and alcohol.

When a non-strong acid catalyst such as phosphoric acid or the like is used in the condensation reaction between components (d-1) and (d-2), a water-soluble photosensitive resin composition compounded in the resulting component (D) may provide a coating film with tackiness. Therefore, it is not suitable for a contact exposure where a negative film is brought into close contact with a photoresist at the time of exposing to light (e.g., at the time of fabricating a shadow mask). That is, a uniform exposure cannot be attained. Furthermore, the resulting condensation product (photopolymerizable monomer) has so poor water resistance after the irradiation of light, that it is not suitable for the etching mask photoresist.

The condensation reaction between components (d-1) and (d-2) in the presence of a strongly acid catalyst produces a (meth)acrylamide methylene group-containing compound (condensation reaction product) represented by the above general formula (IX) (wherein $R_7$ is the same as defined above). Examples of the condensation reaction product preferably include a condensate between N-methylol (meth)acrylamide or N-methoxymethyl methacrylamide and pentaerythritol, a condensate between N-methylol (meth)acrylamide or N-methoxymethyl methacrylamide and glycerine, and a condensate between N-methylol (meth)acrylamide or N-methoxymethyl methacrylamide and trimethylol propane.

In the above condensation reaction, the ratio of the charging amount (m mole) of component (d-2) represented by the general formula (VIII) to the amount (n mole) of hydroxyl group in component (d-1) is preferably approximately by the equation of $m=1/n$ to 1.5 n (mole), more preferably $m=1/n$ to 1.2 n (mole), and most preferably $m=1/n$ to 1.0 n (mole). The generation of a dimer of component (d-2) can be prevented by adjusting the amount of component (d-2) within the above range. As a result, a (meth)acrylamide methylene group-containing compound of component (D), can be obtained in a high yield.

If the amount of the compound represented by the general formula (VIII) is too much, the etching resistance can be observed at the least. However, the detailed observation finds that there is a defect in a coating film, which is remained in the form of eaves protruding over the etched portion (the substrate is subjected to corrosion in a wider area than the dimension of the photoresist in etching). This is because the photoresist film may become too hard. When the phenomenon of causing waves or defects on the eaves-shaped hanging-over portion is observed, the etching solution flows excessively only over that portion. As a result, the etching is performed excessively at that portion or the etching solution cannot flow uniformly all over, so that the final metal etching pattern becomes non uniform and results in an inferior product. On the other hand, if the amount of the compound represented by the general formula (VIII) is too small, it results in poor etching resistance. At the time of reaction, two or more condensates (component (D)) may be mixed together at varied molar ratios to blend the mixture with a negative water-soluble photosensitive resin composition of the present invention. In this case, it is also preferable to define an average usage amount of the compound represented by the general formula (VIII) within the above suitable range.

The condensation reaction can also be conducted in an inactive solvent. It also may be conducted without solvent: the melting point of the compound represented by the general formula (VIII) is, for example, 75° C. for N-methylolacrylamide and 25° C. (room temp.) or less for $C_{1-4}$ alkoxymethyl (meth)acrylamide. Therefore, the reaction can proceed in a molten state with component (d-1) without solvent.

The condensation reaction may be conducted while blowing dried air at room temperature or being heated (about 40–100° C.), and contents of water and alcohol generated may be discharged outside together with the air. Since the reaction proceeds as condensation reaction with dehydration or dealcoholization, it is a matter of course that the contents of water or alcohol in the reaction system should be managed carefully.

The product thus obtained by the condensation between components (d-1) and (d-2) is soluble in water as well as in a mixed solvent of water and water-soluble solvent. In this case, there is no released suspended matter floating on the surface of the waste developer after the development. Therefore, there is no chance to cause environment deterioration by bad smell and the risk of inflammability.

Furthermore, the above condensation product has a photopolymerizing property (photo-curing property) and a coating film thereof obtained after the irradiation of light has excellent water resistance.

Heretofore, most of the photopolymerizable monomers (the photo-curing monomers) incorporated in water-soluble photosensitive resin compositions are insoluble in water as described above (e.g., (meth)acrylic ester-based monomer). If they are developed using water, the monomer is released and floated on the surface of the developer. Therefore, the processing of waste developer becomes difficult. In addition, problems of the risks of flammability, the dispersion of bad smell, and so on have been caused in the art.

Water-soluble photopolymerizable monomers are also known in the art (e.g., JP-57-124730A, JP-60-101531A, and JP-3-172301A). However, the conventional monomers have some disadvantages of insufficient water resistance, etching resistance, and resolution after the irradiation of light, and thus are hardly endurable in use as photoresists for etching masks.

Heretofore, as described above, water-soluble photopolymerizable monomers endurable to the formation of ultra fine-pattern in the fabrication of electronic parts or the like have not been attained.

Therefore, there was no conventional water-soluble photosensitive resin composition having excellent water resistance and capable of being developed with water and used as an etching mask photoresist. However, the fabrication of such a composition has been allowed by the present invention at the first time. In addition, the water-soluble photosensitive resin composition obtained by the present invention has excellent etching resistance endurable to a long-time etching.

Furthermore, monofunctional vinyl monomers and polyfunctional vinyl monomers known in the art can also be used as component (D) besides the compounds described above depending on purposes. Particularly, they can advantageously be used in the case of preparing photosensitive resin compositions soluble in alkaline water and organic solvents instead of preparing water-soluble photosensitive resin composition.

Examples of such a monofunctional vinyl monomer include (meth)acrylamide, methylol (meth)acrylamide, methoxymethyl (meth)acrylamide, ethoxymethyl (meth)acrylamide, propoxymethyl (meth)acrylamide, butoxy methoxymethyl (meth)acrylamide, methyl (meth)acrylate, ethyl (meth)acrylate, butyl (meth)acrylate, 2-ethylhexyl (meth)acrylate, 2-hydroxyethyl (meth)acrylate, 2-hydroxypropyl (meth)acrylate, 2-hydroxybutyl (meth)acrylate, 2-phenoxy-2-hydroxypropyl (meth)acrylate, 2-(meth)acryloyl oxy-2-hydroxypropyl phthalate, glycerine mono(meth)acrylate, tetrahydrofurfuryl (meth)acrylate, dimethylamino (meth)acrylate, glycidyl (meth)acrylate, 2,2,2-trifluoroethyl (meth)acrylate, 2,2,3,3-tetrafluoropropyl (meth)acrylate, (meth)acrylate half esters of phthalic acid derivatives, and N-methylol (meth)acrylamide.

Examples of such a polyfunctional vinyl monomer include ethyleneglycol di(meth)acrylate, diethyleneglycol di(meth)acrylate, tetraethyleneglycol di(meth)acrylate, polyethyleneglycol di(meth)acrylate, propyleneglycol di(meth)acrylate, polypropyleneglycol di(meth)acrylate, butylenesglycol di(meth)acrylate, neopentylglycol di(meth) acrylate, 1,6-hexaneglycol di(meth)acrylate, trimethylolpropane tri(meth)acrylate, glycerine di(meth)acrylate, pentaerythritol di(meth)acrylate, pentaerythritol tri(meth) acrylate, dipentaerythritol penta(meth)acrylate, 2,2-bis(4-(meth)acryloxydiethoxyphenyl)propane, 2,2-bis(4-(meth) acryloxypolyethoxyphenyl)propane, 2-hydroxy-3-(meth) acryloyloxylpropyl (meth)acrylate, ethyleneglycol diglycidylether di(meth)acrylate, diethyleneglycol diglycidylether di(meth)acrylate, phthalic acid diglycidylester di(meth)acrylate, glycerine triacrylate, glycerine polyglycidylether poly(meth)acrylate, urethane (meth)acrylate (e.g., reaction products between diisocyanate compounds such as tolylene diisocyanate, trimethylhexamethylene diisocyanate, and hexamethylene diisocyanate, and 2-hydroxyethyl (meth)acrylate). Component (D) may be used singly or in a combination of two or more thereof.

The amount of each component in the photosensitive resin composition of the present invention is as follows. The following description is in the case of incorporating component (D). If component (D) is not contained in the composition, the amount of component (D) is calculated as zero (0) art by mass.

The amount of each of components (A) and (D) is preferably 5–80 parts by mass, more preferably 10–70 parts by mass with respect to 100 parts by mass of the total amount of components (A), (B), and (D) (solid contents). If the amount of each component (A), (D) is too much, the physical properties of the resulting composition would not be satisfied because of poor coating properties and a brittle photo-cured material to be formed.

In the case of incorporating component (D) in the composition, the ratio of component (D) to component (A) is preferably represented as (D)/(A)=95/5 to 5/95 (mass ratio).

The amount of component (B) is preferably 5–80 parts by mass, more preferably 10–70 parts by mass with respect to 100 parts by mass of the total amount of components (A), (B), and (D) (solid contents). If the amount of component (B) exceeds 80 parts by mass, it becomes difficult to obtain a sufficient sensitivity. On the other hand, if it is less than 5 parts by mass, poor coating property is obtained.

The amount of component (C) is preferably 0.1–10 parts by mass, more preferably 0.3–7 parts by mass with respect to 100 parts by mass of the total amount of the compositions (A), (B), and (D) (solid contents). If the amount of component (C) is less than 0.1 parts by mass, there is the fear of causing insufficient sensitivity. If it exceeds 10 parts by mass, the solubility of the composition is lowered and the composition is then precipitated, so an extremely deteriorated pattern resolution may be caused after the exposure. In addition, increase in optical-absorption on the surface of the film may deteriorate the photo-curing at the lower part of the film in film thickness.

The negative-type photosensitive resin composition of the present invention may further contain, if required, a leveling agent, a thermal polymerization inhibitor, a color generating agent, a coloring agent such as dye and pigment, a filler, an adhesion-promoting agent, and a plasticizer besides main components (A), (B), (C), and (D). These optional additives are not limited to specific ones and may be selected from those well known in the art.

The negative-type photosensitive resin composition of the present invention, which is obtained as described above, can be used for the formation of photoresist for etching without changing any manufacturing apparatus used for the conventional chrome-based photosensitive resin composition.

For instance, in the case of using the negative-type photosensitive resin composition of the present invention in the formation of photoresist for etching, components (B), (C), and (D) are added in a solution (e.g., an aqueous solution) containing component (A) and are then mixed together, followed by applying the mixture as a photoresist coating solution on a metal substrate, such as a 42-alloy material that contains 42% nickel, an invar material that contains 36% nickel, a low-carbon aluminum killed steel, a stainless steel, and a copper substrate, etc., and then drying to form a coating film. The solvent may be water, an alkaline aqueous solution, an organic solvent such as alcohol, or the like. Subsequently, a pattern mask having a desired pattern is brought into close contact with the surface of the coating film and is then exposed to light, followed by developing with water and passing through the step of baking to complete a photoresist for etching.

Coating means is not limited to a specific one. Any means such as a roll coater, a curtain flow coater, a spray coater, a dip coater, or a bar coater may be used. The dry thickness of the coating film is preferably about 1–30 μm, more preferably about 3–20 μm.

Exposure means is not limited to a specific one. Any means such as an extra-high pressure mercury lamp, a chemical lamp, a black lamp, or an arc lamp may be used. Preferably, an exposure lamp that emits light having a wavelength corresponding to an absorption wavelength of the photopolymerization initiator may be selected.

The development may be performed by way of spraying, dipping, showering, or the like.

The photosensitive resin composition of the present invention is excellent in the adhesiveness especially to iron-based alloys, so that it can appropriately be used in the formation of photo masks for the etching of iron/nickel alloy, iron/chrome alloy (stainless steel), or the like. In the present invention, the method of etching is not limited to a specific one, however, a wet etching (an etching solution may be a ferric chloride solution or the like) is preferable because of allowing the photosensitive resin composition of the present invention to exert excellent advantages.

EXAMPLES

The following examples are provided for further illustrating the present invention but are in no way to be taken as limiting.

<Preparation of Product of the Michael Addition Reaction>

Synthetic Example 1

Preparation of Product 1 of the Michael Addition Reaction 30 g of polyethyleneglycol diacrylate (the number of ethylene oxides is 4 (i.e., EO=4)) and 0.01 g of hydroquinone monomethylether were charged into a flask and were then stirred while heating in a hot-water bath at a temperature of 85° C. When an increase in temperature of the inside of the flask was observed, a solution prepared by dissolving 1.5 g of tetraethylenepentamine in 10 g of methyl alcohol was added into the flask through a separatory funnel for 30 minutes in a dropwise manner. After that, the mixture in the flask was further heated and stirred for 4.5 hours. Then, the flask was taken out of the hot-water bath to terminate the reaction. Consequently, a product 1 of the Michael addition reaction (75.91% by mass solution) was obtained.

Synthetic Example 2

Preparation of Product 2 of the Michael Addition Reaction

The product 1 of the Michael addition reaction (75.91% by mass solution) was obtained in a flask in the same manner as that of Synthetic example 1. Then, a solution prepared by dissolving 1.5 g of N-β(aminoethyl)γ-aminopropyltrimethoxysilane ("KBM603" manufactured by Shin-Etsu Chemical Co., Ltd.) in 10 g of methyl alcohol was added into the flask through a separatory funnel for 30 minutes in a dropwise manner. After that, the mixture in the flask was further heated and stirred for 4.5 hours. Then, the flask was taken out of the hot-water bath to terminate the reaction. Consequently, a product 2 of the Michael addition reaction (62.27% by mass solution; a secondary product of the Michael addition reaction) was obtained.

Synthetic Example 3

Preparation of Product 3 of the Michael Addition Reaction 30 g of polyethyleneglycol diacrylate (EO=4) and 0.01 g of hydroquinone monomethylether were charged into a flask and were then stirred while heating in a hot-water bath at a temperature of 85° C. When an increase in temperature of the inside of the flask was observed, a solution prepared by dissolving 1.5 g of tetraethylenepentamine in 10 g of ethyl lactate was added into the flask through a separatory funnel for 30 minutes in a dropwise manner. After that, the mixture in the flask was further heated and stirred for 4.5 hours. Then, the flask was taken out of the hot-water bath to terminate the reaction. Consequently, a product 3 of the Michael addition reaction (75.9% by mass solution) was obtained.

Synthetic Example 4

Preparation of Product 4 of the Michael Addition Reaction 20.3 g of polyethyleneglycol diacrylate (EO=4), 8.7 g of polyethyleneglycol diacrylate (EO=6), and 0.01 g of hydroquinone monomethylether were charged into a flask and were then stirred while heating in a hot-water bath at a temperature of 85° C. When an increase in temperature of the inside of the flask was observed, a solution prepared by dissolving 1.5 g of tetraethylenepentamine in 10 g of ethyl lactate was added into the flask through a separatory funnel for 30 minutes in a dropwise manner. After that, the mixture in the flask was further heated and stirred for 4.5 hours. Then, the flask was taken out of the hot-water bath to terminate the reaction. Consequently, a product 4 of the Michael addition reaction (75.31% by mass solution) was obtained.

Synthetic Example 5

Preparation of Product 5 of the Michael Addition Reaction

The product 4 of the Michael addition reaction (75.31% by mass solution) was obtained in a flask in the same manner as that of Synthetic example 4. Then, a solution prepared by dissolving 0.5 g of N-β(aminoethyl)γ-aminopropyltrimethoxysilane ("KBM603" manufactured by Shin-Etsu Chemical Co., Ltd.) in 10 g of ethyl lactate was added into the flask through a separatory funnel for 30 minutes in a dropwise manner. After that, the mixture in the flask was further heated and stirred for 4.5 hours. Then, the flask was taken out of the hot-water bath to terminate the reaction. Consequently, a product 5 of the Michael addition reaction (61.51% by mass solution; a secondary product of the Michael addition reaction) was obtained.

Synthetic Example 6

Preparation of Product 6 of the Michael Addition Reaction 20.3 g of polyethyleneglycol diacrylate (EO=4), 8.7 g of polyethyleneglycol diacrylate (EO=6), and 0.01 g of hydroquinone monomethylether were charged into a flask and were then stirred while heating in a hot-water bath at a temperature of 85° C. When an increase in temperature of the inside of the flask was observed, a solution prepared by dissolving 1.5 g of tetraethylenepentamine and 0.5 g of N-β(aminoethyl)γ-aminopropyltrimethoxysilane ("KBM603" manufactured by Shin-Etsu Chemical Co., Ltd.) in 10 g of ethyl lactate was added into the flask through a separatory funnel for 30 minutes in a dropwise manner. After that, the mixture in the flask was further heated and stirred for 4.5 hours. Then, the flask was taken out of the hot-water bath to terminate the reaction. Consequently, a product 6 of the Michael addition reaction (75.62% by mass solution) was obtained.

Synthetic Example 7

A product 7 of the Michael addition reaction (75.62% by mass solution) was obtained in the same manner as that of Synthetic example 6, except that diethylenetriamine was used instead of tetraethylenepentamine.

Synthetic Example 8

A product 8 of the Michael addition reaction (75.62% by mass solution) was obtained in the same manner as that of Synthetic example 6, except that triethylenetetramine was used instead of tetraethylenepentamine.

Synthetic Example 9

A product 9 of the Michael addition reaction (75.62% by mass solution) was obtained in the same manner as that of Synthetic example 6, except that pentaethylenehexamine was used instead of tetraethylenepentamine.

Synthetic Example 10

A product 10 of the Michael addition reaction (75.62% by mass solution) was obtained in the same manner as that of Synthetic example 6, except that "Heavy Polyamine X" (manufactured by Union Carbide Corporation) was used instead of tetraethylenepentamine.

The present inventors confirmed that each of the products 1–10 of the Michael addition reaction obtained in respective Synthetic examples 1–10 was soluble in water when the water was added, so that we concluded that these products were water-soluble compounds, respectively.

Comparative Synthetic Example 1

Preparation of Product 11 of the Michael Addition Reaction

A product 11 of the Michael addition reaction (75.31% by mass solution) was obtained in the same manner as that of Synthetic example 4, except that hexamethylene diamine was used instead of tetraethylenepentamine.

The present inventors confirmed that the product 11 of the Michael addition reaction was insoluble in water when the water was added.

Comparative Synthetic Example 2

Preparation of Product 12 of the Michael Addition Reaction

A product of the Michael addition reaction was obtained in the same manner as that of Synthetic example 1, except that 1,6-hexanediol di(meth)acrylate was used instead of polyethyleneglycol diacrylate (EO=4). And furthermore, using the reaction product, a product 12 of the Michael addition reaction (a secondary product of the Michael addition reaction) was obtained in the same manner as that of Synthetic example 2.

The present inventors confirmed that the product 12 of the Michael addition reaction was insoluble in water when the water was added.

Comparative Synthetic Example 3

Preparation of Product 13 of the Michael Addition Reaction

A product of the Michael addition reaction was obtained in the same manner as that of Synthetic example 1, except that polytetramethyleneglycol diacrylate was used instead of polyethyleneglycol diacrylate (EO=4). And furthermore, using the reaction product, a product 13 of the Michael addition reaction (a secondary product of the Michael addition reaction) was obtained in the same manner as that of Synthetic example 2.

The present inventors confirmed that the product 13 of the Michael addition reaction was insoluble in water when the water was added.

<Preparation of Water-Soluble Binder Polymer>

Synthetic Example 11

A stirrer, a thermometer, a reflux condenser, and a dropping funnel were attached to a separable flask. Then, 500 g of a 20% by mass solution of polymethacrylic acid ("Jurymer AC30H" manufactured by Nihon Junyaku Co., Ltd.) was poured into the flask and was then heated. When the temperature-reached at 95° C., 1.12 g of triethylamine, 0.11 g of hydroquinone monomethylether, and 47.9 g of glycidylmethacrylate were added to allow the reaction to proceed for 4.5 hours.

Subsequently, a solution obtained by dissolving 1.00 g of N-β(aminoethyl)γ-aminopropyltrimethoxysilane ("KBM603" manufactured by Shin-Etsu Chemical Co., Ltd.) in 5.6 g of ethyl alcohol was added into the flask through a separatory funnel for 60 minutes in a dropwise manner to allow the reaction to proceed for another 3.5 hours.

After terminating the reaction, 195 g of ethyl lactate was added in the reaction product to obtain a polymer (20% by mass solution) as a final product.

<Preparation of Photopolymerizable Compound>

Synthetic Example 12

68 g of pentaerythritol and 202 g of N-methylolacrylamide were heated to melt. Then, 2.08 g of p-toluene sulfonic acid was added in the melted mixture, followed by stirring for 1.5 hours. Subsequently, water was added in the mixture and then the mixture was neutralized by the addition of ammonia water. And furthermore, the mixture was diluted with water to obtain a photopolymerizable compound (40% by mass aqueous solution) as a final product.

I. Printing Photosensitive Resin Plate

Example 1

A negative-type photosensitive resin composition was prepared as follows. First, 100 parts by mass of poval (PVA505, manufactured by Kuraray CO., Ltd.) having a saponification degree of 71.5–74.5 mole % and a polymerization degree of 500 were dissolved in a mixture of 100 parts by mass of water and 20 parts by mass of methyl alcohol. Then, 50 parts by mass of a condensate between N-methylolacrylamide and dimethoxymethyl urea as component (D), 8 parts by mass of benzyldimethylketal as component (C), 65.9 parts by mass of the product 1 of the Michael addition reaction (75.91% by mass solution) prepared in Synthetic example 1 as component (A), and 0.05 parts by mass of methyl hydroquinone as the thermal polymerization inhibitor were added in the above solution to prepare a negative-type photosensitive resin composition.

The resulting negative-type photosensitive resin composition was applied on a polyester film using an applicator and was then dried by subjecting to a drying machine for overnight. Consequently, a photosensitive film of 0.7 mm in thickness was formed, and it was a transparent thick film where no content seeps out of the surface thereof.

The photosensitive film was bonded on the surface of an iron plate being coated with an adhesive such that the film was located on the outside. Subsequently, a vacuum contact exposure to light from a 5-kW extra-high pressure mercury lamp was performed for 20 seconds using a negative film.

After that, the pattern formation was performed by brush development with water. Consequently, a photosensitive resin plate, on which a desired pattern on the negative film was accurately reproduced, was obtained.

A visual observation was conducted to find the oil content (separated substance being suspended) on the surface of the waste developer in a tank for collecting waste developer. As a result, there was no oil content floated on the surface of the waste developer and also there was no smell generated from the oil content.

Furthermore, when the resulted photosensitive resin plate was used as a printing plate, a printed matter having a good retention of ink was obtained.

Comparative Example 1

A photosensitive film was obtained in the same manner as that of Example 1, except that 50 parts by mass of polyethyleneglycol diacrylate (EO=4) was used instead of 65.9 parts by mass of the product 1 of the Michael addition reaction (75.91% by mass solution).

The present inventors observed that the contents seeped out of the surface of the photosensitive film, and also there was a smell of polyethyleneglycol diacrylate (EO=4).

Subsequently, a photosensitive resin plate was formed in the same manner as that of Example 1.

A visual observation was conducted to find the oil content (separated substance being suspended) on the surface of the waste developer in a tank for collecting waste developer. As a result, there was the oil content floated on the surface of the waste developer and also there was a smell of polyethyleneglycol diacrylate (EO=4).

Example 2

A photosensitive film was prepared in the same manner as that of Example 1, except that 80.3 parts by mass of the product 2 of the Michael addition reaction (62.27% by mass solution, a secondary product of the Michael addition reaction) instead of 65.9 parts by mass of the product 1 of the Michael addition reaction (75.91% by mass solution)

The photosensitive film was a transparent thick film from which any content of the photosensitive film did not seep.

Next, just as in the case with Example 1, a photosensitive resin plate was prepared.

A visual observation was conducted to determine the presence or absence of the oil content (separated substance being suspended) on the surface of the waste developer in the tank for collecting waste developer. As a result, there was no oil content on the liquid surface and also there was no generation of bad smell.

Furthermore, when the resulted photosensitive resin plate was used as a printing plate, a printed matter having a good retention of ink was obtained.

II. Etching Photoresist

Example 3

First, 13.6 parts by mass of a binder polymer (20% by mass solution) prepared in Synthetic example 11 (provided as component (B)), 6 parts by mass of a condensate between N-methylolacrylamide and pentaerythritol, which is a photopolymerizable compound (40% by mass solution) prepared in Synthetic example 12 (provided as component (D)), 0.144 parts by mass of benzildimethylketal (provided as component (C)), 0.66 parts by mass of the product 1 of the Michael addition reaction (75.91% by mass solution) prepared in Synthetic example 1 (provided as component (A)), and 0.01 parts by mass of methyl hydroquinone as the thermal polymerization inhibitor were mixed and dissolved together to prepare a negative-type photosensitive resin composition.

The resulting composition was coated on an iron plate of 125 μm in thickness using a bar coater No. 30 and was then dried at a temperature of 70° C.

Next, the coated iron plate was subjected to the exposure to light from a 5-kW extra-high pressure mercury lamp for 20 seconds (74 mJ), followed by the development using a shower of tap water. Consequently, a negative photoresist pattern for etching was formed.

Subsequently, the plate was subjected to a baking treatment at 230° C. for 10 minutes and then to an etching treatment using a ferric chloride solution (a Baume degree of 45) at 45° C. for 5 minutes, followed by washing with water and drying to obtain an etching sample.

In the process of etching a metal, by the way, the metal is typically etched in a wider area than the width of a photoresist pattern. Thus, the photoresist on the metal etching pattern protrudes over like eaves (side etch). In this etching sample, the resulting photoresist coating is a superior film without swelling and delamination, but a simply partial defect in the eaves.

Example 4

An etching sample was obtained in the same manner as that of Example 3, except that 0.827 parts by mass of the product 5 of the Michael addition reaction (61.51% by mass solution, a secondary product of the Michael addition reaction) prepared in Synthetic example 5 was used instead of 0.67 parts by mass of the product 1 of the Michael addition reaction (75.91% by mass solution).

In the etching sample, no defect in the eaves was observed, and the resulting photoresist coating was a superior film without swelling and delamination.

Comparative Example 2

An etching sample was obtained in the same manner as that of Example 3, except that 0.51 parts by mass of polyethyleneglycol diacrylate (EO=9) was used instead of 0.67 parts by mass of the product 1 of the Michael addition reaction (75.91% by mass solution).

The etching sample was evaluated just as in the case with Example, 3. As a result, there was a defect in the eaves and a wavy portion caused by swelled eaves. Therefore, the photosensitive resin composition was not suitable for being used as a coating film.

Furthermore, a visual observation was conducted to determine the presence or absence of the oil content (separated substance being suspended) on the surface of the waste developer in the tank for collecting waste developer. As a result, there was no oil content on the liquid surface, however there was a smell of ester.

Comparative Example 3

An etching sample was obtained in the same manner as that of Example 3, except that 0.51 parts by mass of polyethyleneglycol diacrylate (EO=4) was used instead of 0.67 parts by mass of the product 1 of the Michael addition reaction (75.91% by mass solution).

The etching sample was evaluated just as in the case with Example 3. As a result, there was no defect in the eaves and also no wavy portion caused by swelling in the eaves. However, the component had a poor compatibility with the resin. It was observed that the content seeped out of the surface of the photosensitive film after coating and drying.

Furthermore, a visual observation was conducted to determine the presence or absence of the oil content (separated substance being suspended) on the surface of the waste developer in the tank for collecting waste developer. As a result, the oil content was found on the liquid surface with a smell of ester.

Example 5

An etching sample was obtained in the same manner as that of Example 4, except that the product 6 of the Michael addition reaction prepared in Synthetic example 6 was used instead of the product 5 of the Michael addition reaction.

In the etching sample, no defect in the eaves was observed, and the resulting photoresist coating was a superior film without swelling and delamination.

Example 6

An etching sample was obtained in the same manner as that of Example 4, except that the product 7 of the Michael addition reaction prepared in Synthetic example 7 was used instead of the product 5 of the Michael addition reaction.

The etching sample had a little defect in the eaves. However, it is no problem from a practical standpoint. The resulting photoresist coating was a superior film without swelling and delamination.

Example 7

An etching sample was obtained in the same manner as that of Example 4, except that the product 8 of the Michael addition reaction prepared in Synthetic example 8 was used instead of the product 5 of the Michael addition reaction.

The etching sample had a little defect in the eaves. However, it was no problem from a practical standpoint. The resulting photoresist coating was a superior film without swelling and delamination.

Example 8

An etching sample was obtained in the same manner as that of Example 4, except that the product 9 of the Michael addition reaction prepared in Synthetic example 9 was used instead of the product 5 of the Michael addition reaction.

In the etching sample, no defect in the eaves was observed, and the resulting photoresist coating was a superior film without swelling and delamination.

Example 9

An etching sample was obtained in the same manner as that of Example 4, except that the product 10 of the Michael addition reaction prepared in Synthetic example 10 was used instead of the product 5 of the Michael addition reaction.

In the etching sample, no defect in the eaves was observed, and the resulting photoresist coating was a superior film without swelling and delamination.

III. Slurry to be Used in the Phosphor Patterning

Example 10

131.7 pats by mass of poval ("Poval GH20" manufactured by Nippon Synthetic Chemical Industry Co., Ltd.) with a saponification degree of 86.5–89% and a polymerization degree of 2350 (10% by mass solution) (provided as component (B)), 168.75 parts by mass of a condensate between N-methylolacrylamide and pentaerythritol (a photopolymerizable compound prepared in Synthetic example 12 (40% by mass aqueous solution))(provided as component (D)), 22.4 parts by mass of the product 3 of the Michael addition reaction (75.9% by mass solution) prepared in Synthetic example 3 (provided as component (A)), and 0.014 parts by mass of methylhydroquinone provided as the thermal polymerization inhibitor were mixed together. Then, the mixture was further mixed with 3.66 parts by mass of water and dissolved. At last, 300 parts by mass of a phosphor for color TV ("P22-B1" manufactured by Kasei Optonix, Ltd.) were mixed with and dispersed in the mixture to prepare a negative-type photosensitive resin composition.

The resulting composition was provided as a slurry for the phosphor patterning and was then coated on a glass plate (1 mm in thickness and 10 cm in width) by spin-coating at 400 rpm, followed by drying at 70° C. for 20 minutes. Then, the glass plate was subjected to the exposure to light through a shadow mask placed at a position about 5 mm away from the surface of the film on the glass plate.

Subsequently, the glass plate was subjected to the development using a shower of water to obtain the phosphor pattern.

The film thickness of the phosphor pattern thus obtained was 12 μm.

Furthermore, the above steps were additionally repeated two times. That is, using the above coating solution (the slurry of the phosphor), the steps from the coating to the phosphor patterning were repeated two times on the substrate on which the above phosphor pattern was formed.

During the exposure, three exposure treatments in total were performed such that the patterning positions were not overlapped on each other by shifting the exposure position of each treatment from the others.

The resulting phosphor patterns were observed. As a result, each phosphor pattern formed by each of three patterning steps was one having a uniform shape without changes in the thickness of the phosphor and the width of strip. These patterns exhibited their excellent water resistance, respectively.

The negative-type photosensitive resin composition prepared using the product of the Michael addition reaction of the present invention provides excellent water resistance and excellent etching resistance when used as a photoresist pattern. Therefore, in the case of the wet-etching treatment on a metal substrate, the etching solution causes a little or negligible change in the shape of the pattern (e.g., defected, swelled, or deformed photoresist pattern). Therefore, the composition can preferably be used as an etching photoresist. The composition can preferably be used as a slurry for the phosphor patterning of CRT because of no change in thickness and width of the pattern even though the phosphor pattern is repetitively subjected to the developer. The composition is also suitable for a water-soluble photosensitive resin plate of being affected by variations in humidity. Furthermore, the composition can broadly be favorable in the fields of dry-film photoresist, aqueous photosensitive paint, and aqueous photosensitive adhesives, etc.

What is claimed is:

1. A negative-type photosensitive resin composition, comprising:

component (A) being a product of the Michael addition reaction between an amino group-containing compound (a-1) represented by the general formula (I):

(I)

wherein n is an integral number of 1–4, and a polyethyleneglycol di(meth)acrylate (a-2) represented by the general formula (II):

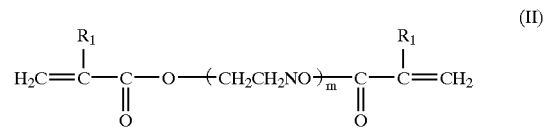

(II)

wherein $R_1$ is a hydrogen or a methyl, and m is an integral number of 4–14.

2. The negative-type photosensitive resin composition according to claim 1, wherein component (A) is a product of the Michael addition reaction between an organic silicon compound (a-3) containing an amino group and/or an imino group and the product of the Michael addition reaction between component (a-1) and component (a-2).

3. The negative-type photosensitive resin composition according to claim 2, wherein component (a-3) is a compound represented by the general formula (III):

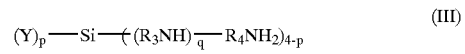

(III)

wherein Y is an alkyl or an alkoxy each having 1–3 carbon atoms, $R_3$ and $R_4$ independently represent divalent hydrocarbon groups having 1–5 carbon atoms, p is an integral number of 1–3, and q is an integral number of 0–3; and two or more Y may be identical or different when p is 2 or 3, with the proviso that two or more $R_3$ may be identical or different when q is 2 or 3.

4. The negative-type photosensitive resin composition according to claim 3, wherein the compound represented by the general formula (III) is at least one selected from the group consisting of compounds represented by the respective general formulae (IV), (V), and (VI):

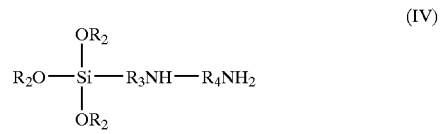

(IV)

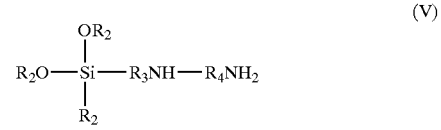

(V)

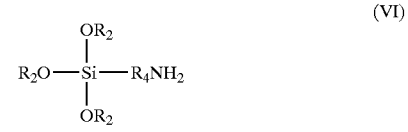

(VI)

wherein $R_2$ is an alkyl having 1–3 carbon atoms, and $R_3$ and $R_4$ are the same as defined in the general formula (III).

5. The negative-type photosensitive resin composition according to claim 1, wherein the Michael addition reaction is conducted using a solution of component (a-1) with a concentration of 5–30% by mass, dissolved in a water-soluble solvent having a boiling point of 64–200° C.

6. The negative-type photosensitive resin composition according to claim 1, wherein the Michael addition reaction is conducted under a condition in which a charged molar ratio of component (a-2) to component (a-1) is 4.5–15.

7. The negative-type photosensitive resin composition according to claim 1, further comprising a binder polymer (B) and a photopolymerization initiator (C).

8. The negative-type photosensitive resin composition according to claim 7, wherein
component (B) is a polymer obtained by the Michael addition reaction between
a polymer (b-1) having a structural unit represented by the general formula (VII):

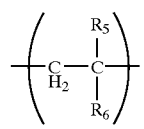

(VII)

wherein $R_5$ is a hydrogen or a methyl, $R_6$ is a substituted or unsubstituted hydrocarbon group having an unsaturated double bond capable of being subjected to the Michael addition reaction, wherein the hydrocarbon group may include at least one group selected from the group consisting of

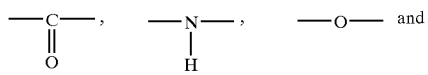

an organic silicon compound (b-2) containing an amino group/or an imino group.

9. The negative-type photosensitive resin composition according to claim 1, further comprising a photopolymerizable compound (D) having at least one polymerizable ethylenic unsaturated bond in its molecular structure.

10. The negative-type photosensitive resin composition according to claim 9, wherein
component (D) is a compound having a (meth)acrylamide methylene group, the compound being obtained by reaction a compound (d-1) having at least one alcoholic hydroxyl group in its molecular structure and a compound (d-2) represented by the general formula (VIII):

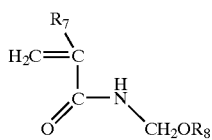

(VIII)

wherein $R_7$ is a hydrogen or a methyl, and $R_8$ is a hydrogen or an alkyl having 1 to 4 carbons)

in the presence of a strong acid catalyst, the compound being represented by the general formula (IX):

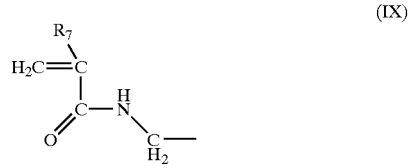

(IX)

wherein $R_7$ is the same as defined in the general formula (VIII).

11. A product of the Michael addition reaction to be used for preparing a negative-type photosensitive resin composition, the product being obtained by the Michael addition reaction between an amino group-containing compound (a-1) represented by the general formula (I):

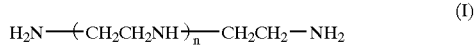

(I)

wherein n is an integral number of 1–4, and
a polyethyleneglycol di(meth)acrylate (a-2) represented by the general formula (II):

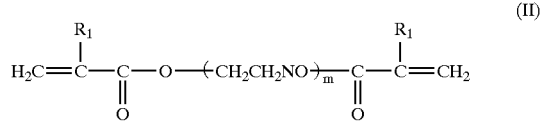

(II)

wherein $R_1$ is a hydrogen or a methyl, and m is an integral number of 4–14.

12. The product of the Michael addition reaction according to claim 11, wherein the product is a product of the Michael addition reaction between an organic silicon compound (a-3) containing an amino group and/or an imino group and the product of the Michael addition reaction between component (a-1) and component (a-2).

* * * * *

UNITED STATES PATENT AND TRADEMARK OFFICE
CERTIFICATE OF CORRECTION

PATENT NO. : 6,806,032 B2
DATED : October 19, 2004
INVENTOR(S) : Hiroshi Takanashi et al.

It is certified that error appears in the above-identified patent and that said Letters Patent is hereby corrected as shown below:

Title page,
Item [57], ABSTRACT, please change Formula (II) as follows
"
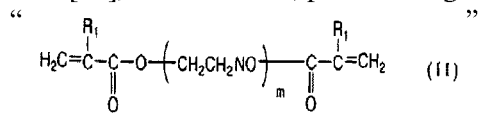
"

to
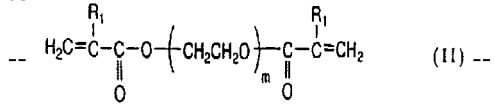

Column 7,
Lines 56 to 62, please change Formula (II) as follows:
"
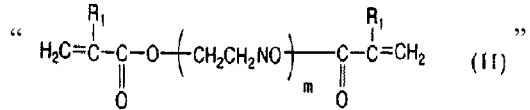
"

to --
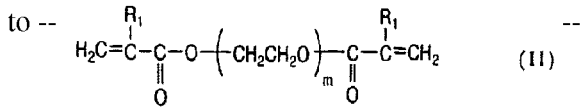
--

Column 8,
Lines 13 to 19 and 37 to 43, please change Formula (II) as follows:
"
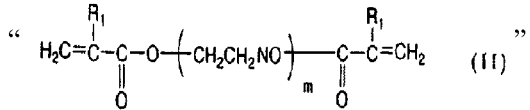
"

to --
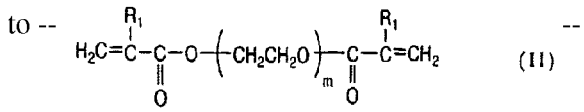
--

Column 34,
Lines 1 to 7, please change Formula (II) as follows:
"
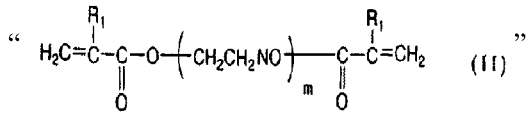
"

to --
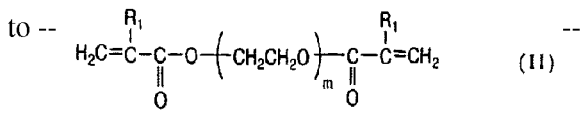
--

UNITED STATES PATENT AND TRADEMARK OFFICE
CERTIFICATE OF CORRECTION

PATENT NO. : 6,806,032 B2
DATED : October 19, 2004
INVENTOR(S) : Hiroshi Takanashi et al.

It is certified that error appears in the above-identified patent and that said Letters Patent is hereby corrected as shown below:

<u>Column 36,</u>
Lines 32 to 38, please change Formula (II) as follows:

" 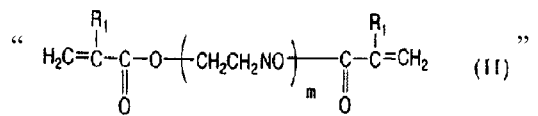 (II) "

to -- 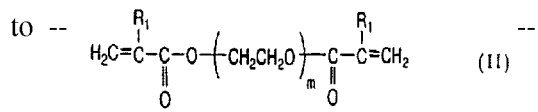 (II) --

Signed and Sealed this

Fifteenth Day of February, 2005

JON W. DUDAS
*Director of the United States Patent and Trademark Office*